United States Patent [19]
Gates, Jr. et al.

[11] Patent Number: 4,956,746
[45] Date of Patent: Sep. 11, 1990

[54] STACKED WAFER ELECTRONIC PACKAGE

[75] Inventors: Louis E. Gates, Jr., Westlake Village; Charles A. Finnila, Manhattan Beach, both of Calif.

[73] Assignee: Hughes Aircraft Company, Los Angeles, Calif.

[21] Appl. No.: 329,991

[22] Filed: Mar. 29, 1989

[51] Int. Cl.$^5$ .............................................. H05K 7/20
[52] U.S. Cl. .................... 361/385; 165/104.33; 357/82; 361/382; 361/396
[58] Field of Search .................. 174/15.1; 211/41; 357/76, 82; 165/80.4, 104.33; 361/393–396, 382–388, 412, 413

[56] References Cited

U.S. PATENT DOCUMENTS

| | | | |
|---|---|---|---|
| 3,290,559 | 12/1966 | Kirby | 361/396 |
| 3,515,949 | 6/1970 | Michaels | 361/396 |
| 4,158,875 | 6/1979 | Tajima | 361/385 |
| 4,493,010 | 1/1985 | Morrison | 165/104.33 |
| 4,603,344 | 7/1986 | Trommer | 361/396 |
| 4,712,158 | 12/1987 | Kikuchi | 361/385 |
| 4,841,355 | 6/1989 | Parks | 357/82 |

OTHER PUBLICATIONS

Universal Electronic Package, Goldmann, IBM Tech. Discl. Bull., vol. 27, No. 6, Nov. 1984, p. 3335.

*Primary Examiner*—Gerald P. Tolin
*Attorney, Agent, or Firm*—Leonard A. Alkov; Wanda K. Denson-Low

[57] ABSTRACT

The electronic package (10) is comprised of a plurality of support plates (12–24), each of which has a plenum therein and preferably webs extending into the plenum for fluid flow control and heat transfer. A wafer (104) is mounted in a recess (100) in the support plate (12) so that fluid in the plenum (52) directly cools the wafer. Electrical connection is by flexible cable (108) to an exterior printed wiring board (40). The package may have any selected number of support plates, and each support plate may carry one full-sized wafer for compact packaging.

21 Claims, 4 Drawing Sheets

STACKED WAFER ELECTRONIC PACKAGE

FIELD OF THE INVENTION

This invention is directed to a structure which comprises a plurality of support plates which each support an integrated circuit wafer and permit connection to the wafers. Passages and plenums in the support plates control the flow of coolant fluid past the wafers and support plates.

BACKGROUND OF THE INVENTION

The conventional way of supporting and protecting individual very large-scale integrated circuit chips and gate array chips consists of mounting such chips in a single chip package or in a multi-chip hybrid circuit package. The packages are then mounted on printed wiring boards and associated with a plurality of other such printed wiring boards. The printed wiring boards are protected and enclosed in a comparatively large enclosure. Volume efficiency of such electronic packaging is very low because there is a great deal of printed wiring board, enclosure and package for each chip. Similarly, the weight is high for the same reasons. Circuit performance is impaired by long signal lines with concomitant undesirable impedance, crosstalk, excessive capacitance, uneven power forms, voltage drops and other electrical problems. In order to reduce the very great number of interconnections external to the integrated circuit in conventional packaging, in accordance with this invention it is practical to interconnect circuit elements at the wafer level, providing element yields are sufficiently high to permit this. The net number of external connections from a complex wafer can be vastly lower than if the elements are separated and individually packaged as chips. This however, then requires that wafers be interconnected directly, rather than as individual chips in packages. Thus, there is need for providing an interconnection method which permits the dense packaging of high density, integrated circuit wafers, together with permitting connections to the wafers and cooling of the wafers while the wafers are well protected from hostile environment.

SUMMARY OF THE INVENTION

In order to aid in the understanding of this invention, it can be stated in essentially summary form that it is directed to a stacked wafer electronic package wherein a plurality of support plates are stacked together. Each of the support plates has a wafer position thereon for the direct attachment of a wafer. These wafers have edge connection pads for connection by ribbon cable which extends out from the support plate. The support plate has fluid passages therein for coolant. When a plurality of such support plates is stacked and clamped, the resultant package defines coolant passages and encloses the wafers.

It is thus a purpose and advantage of this invention to provide a plurality of stacked support plates, each of which supports a wafer and which has provision for ribbon conductors to directly connect to the pads on the wafer so that a plurality of such support plates can be stacked to protect and cool the wafers supported thereon.

It is another purpose and advantage of this invention to provide stacked support plates, each carrying a wafer directly thereon, with the support plates provided with coolant flow channels so that coolant fluid passes directly past the wafers and past the support plates to maximize cooling and minimize hot spots to provide for high performance, high-speed electronic systems particularly suitable for compact, low weight systems.

Other purposes and advantages of this invention will become apparent from a study of the following portion of this specification, the claims and the attached drawings wherein:

DESCRIPTION OF THE PREFERRED EMBODIMENT

Figure 1:
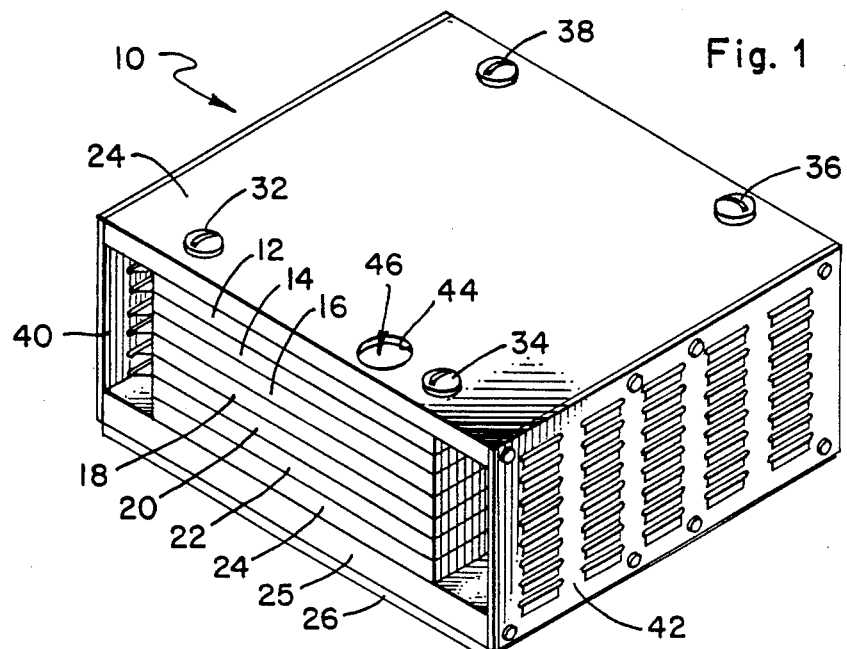
FIG. 1 is an isometric view of the stacked wafer electronic package of this invention.
Figure 2:
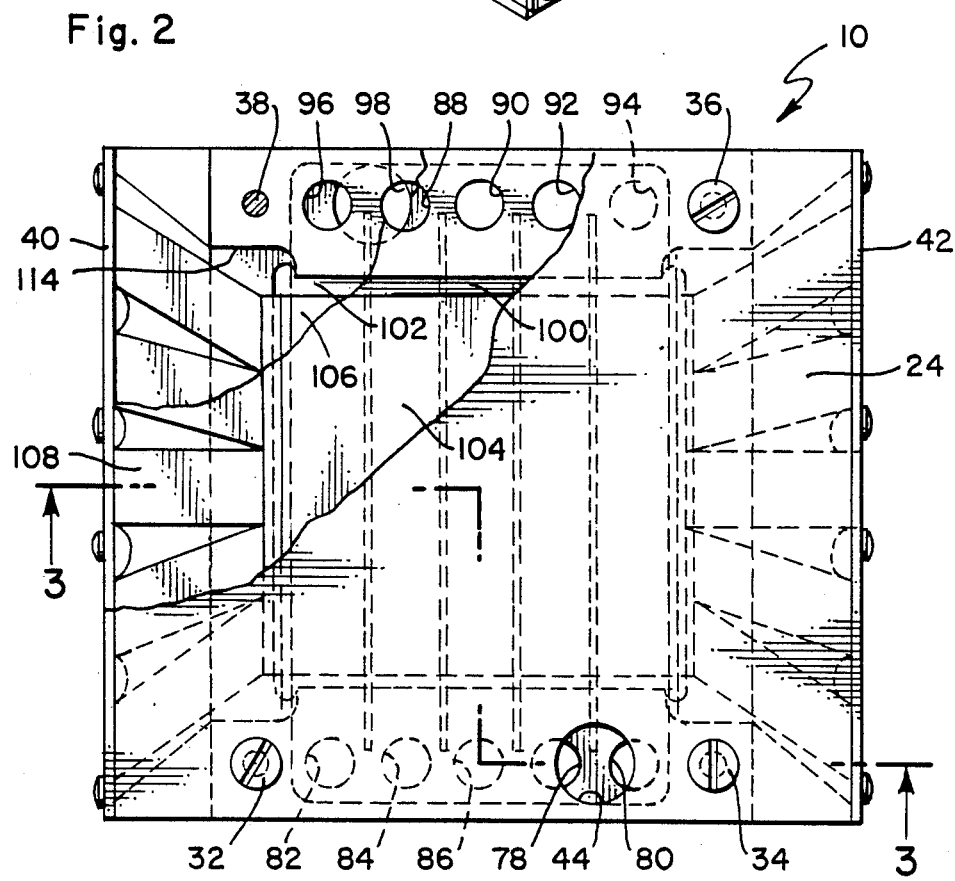
FIG. 2 is an enlarged plan view thereof, with parts broken away.
Figure 3:
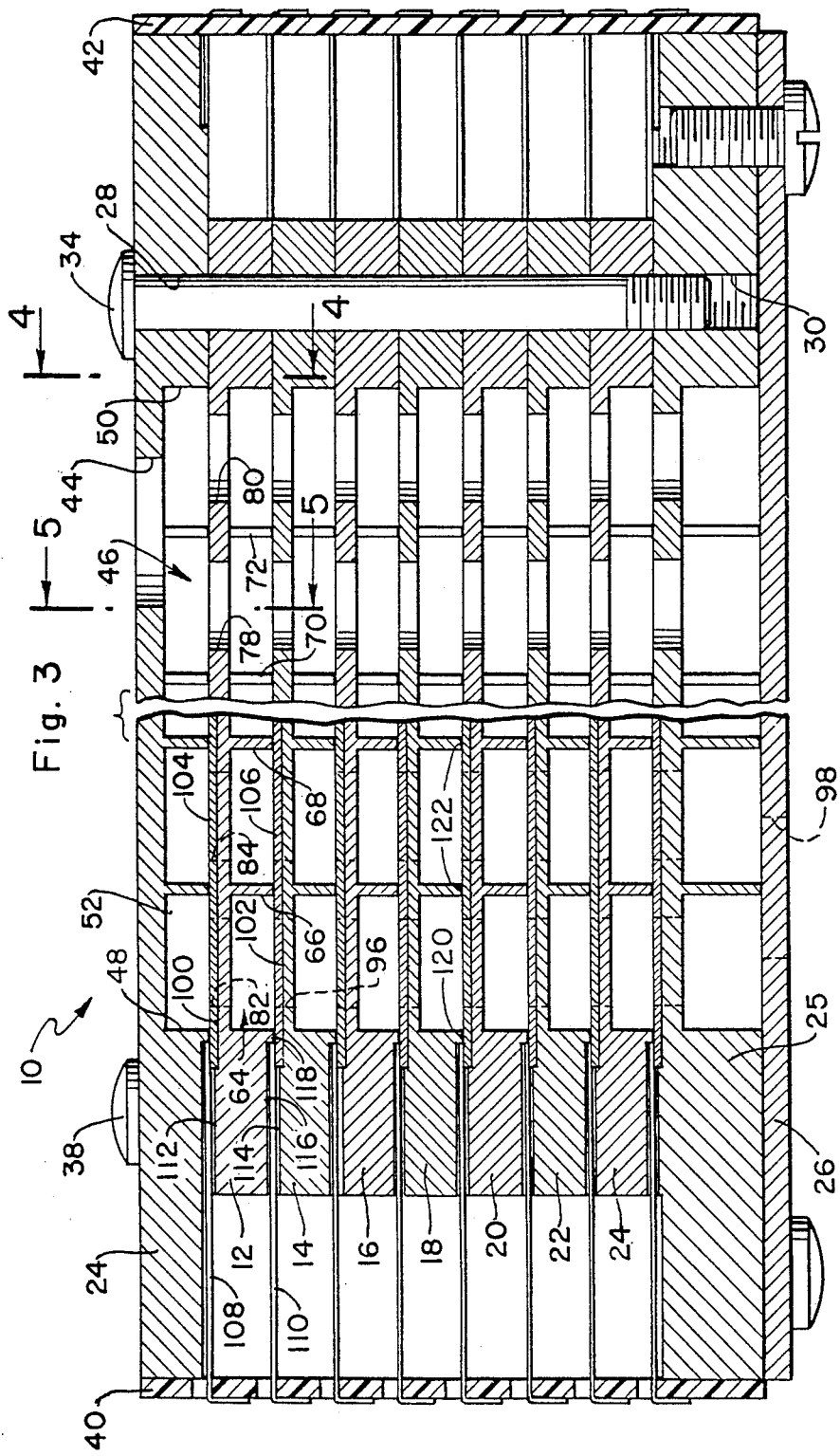
FIG. 3 is a further enlarged section taken generally along the line 3—3 of FIG. 2, with parts broken away.

The stacked wafer electronic package of this invention is generally indicated at 10 in FIGS. 1, 2 and 3. The package is comprised of a plurality of stacked layers secured together. The inner layers are support plates, each being identical. Support plates 12, 14, 16, 18, 20, 22 and 24 are shown in FIGS. 1 and 3. The support plates are stacked in alignment and are identical, as will become apparent hereinafter. Top plate 24 and bottom plate 25 respectively cover the top and bottom of the stacked support plates. The aligned support plates have clearance holes drilled therethrough, one of which is indicated at 28 in FIG. 3, while bottom plate 25 has an aligned threaded hole 30 therein. Clamp bolts 32, 34, 36 and 38 have heads which engage on the top of top plate 24, as seen in FIG. 1. The clamp bolts pass down through the clearance holes in the top plate and support plates and are threadedly engaged in the threaded holes in the bottom plate, as is best seen in FIG. 3, for bolt 34. This secures the stacked plates tightly together into a firm assembly. The top plate 24 serves to cover the stack of support plates and provide an inlet structure for the distribution of a coolant fluid. Bottom plate 25 is the bottom member, but also serves to support a wafer in the same manner as the support plates. It also supports the interconnection boards. Bottom cover 26 is attached by screws under bottom plate 25 and serves as a collector of coolant fluid.

Figure 5:
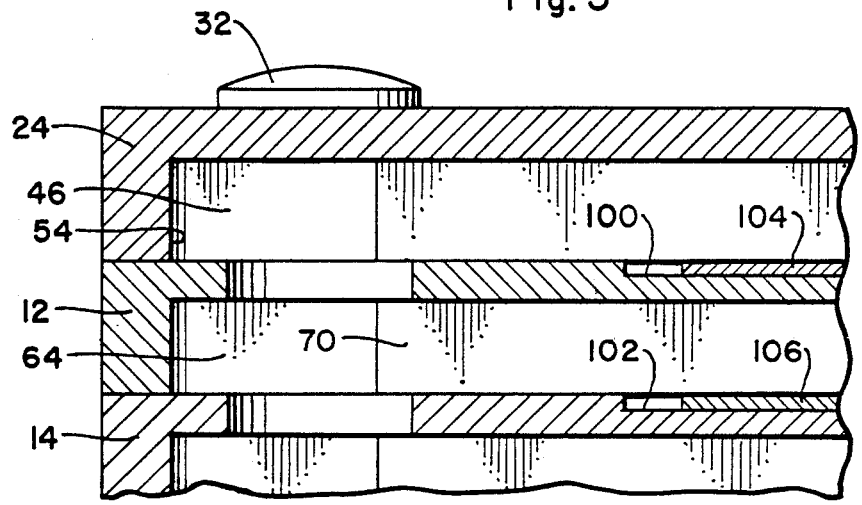
FIG. 5 is a section taken generally along line 5—5 of FIG. 7 with parts broken away.

The ends of the top plate and bottom plate, as seen in the left-to-right direction in FIG. 3, extend beyond both ends of the aligned support plates. These extended ends provide support for interconnection boards 40 and 42, which are seen in FIGS. 1, 2 and 3. Top plate 24 has a fluid inlet opening 44 which has suitable means for connecting a fluid coolant supply thereto, such as a tube fitting. The coolant may be gaseous, but is preferably a dielectric liquid for maximum cooling. Below fluid inlet opening 44 is a plenum 46, which is also seen in FIG. 5. The plenum 46 is a recess formed upwardly from the bottom surface of top plate 24 and extends from wall 48 at the left end of the plenum, as seen in FIG. 3, to wall 50 on the right end. The plenum is also defined by the far wall 52 in FIG. 3 and the near wall 54, which is seen at the left side of FIG. 5. The rectangular plenum is divided into five spaces in the left-to-right direction in FIG. 5 by means of four webs 66, 68, 70 and 72 seen in FIGS. 3 and 5. As seen in FIG. 5, these webs do not extend the full left-to-right distance in FIG. 5 or the top to bottom direction in FIG. 2 so that the inlet opening 44 communicates down the end of the plenum to the spaces defined between the webs.

Figure 6:
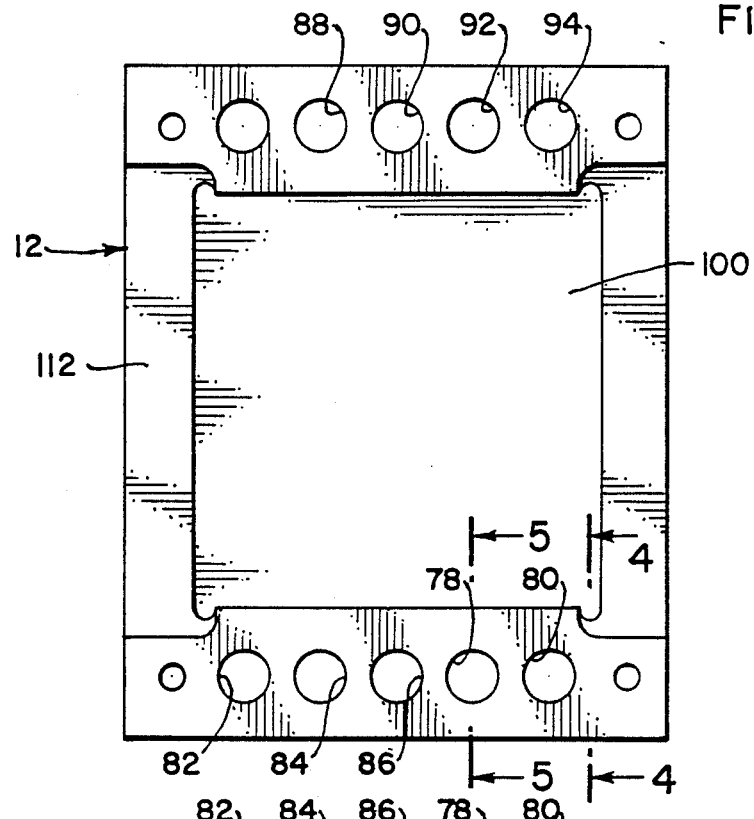
FIG. 6 is a plan view of one of the support plates, as seen generally along the line 6—6 of FIG. 4, without the wafers and connectors in place.
Figure 7:
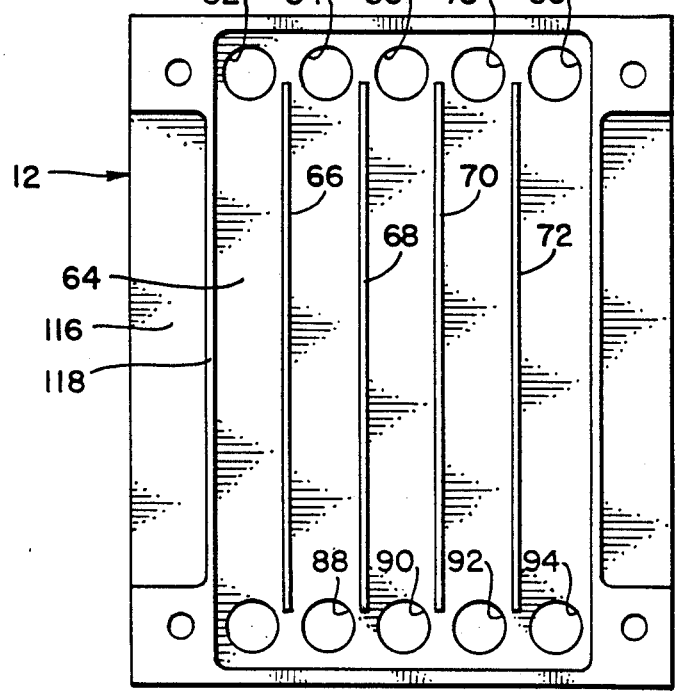
FIG. 7 is a bottom view of the same plate, as seen generally along the line 7—7 of FIG. 4.

Support plate 12 is positioned directly underneath the top plate 24 and is in direct contact with a substantial portion of its area. The support plate 12 is rectangular and has clearance holes therethrough, as previously described, to receive the shanks of the clamp bolts. A plenum 64 is formed on the bottom of support plate 12. The plenum is rectangular in configuration and is divided by webs 66, 68, 70 and 72 into five transverse channels. Similarly to the webs in top plate 24, the webs 66 through 72 do not extend to the far and near walls 74 and 76. Circulation holes through support plate 12 into the plenum permit downflow of the coolant fluid from plenum 46. Circulation holes 78 and 80 are seen down through the inlet opening 44 in FIG. 2, and these holes are also seen in FIGS. 3, 6 and 7. As is seen in FIG. 2, there is a circulation hole at the near and far ends of the plenum in the spaced defined by the dividing webs. Circulation holes 82, 84 and 86 are shown in dashed lines in FIG. 2 and in full lines in FIGS. 6 and 7. At the upper portion of FIG. 2, the top plate 24 is broken away so that circulation holes 88, 90 and 92 are fully seen, while their companion hole 94 is shown in dashed lines beneath the portion of the top plate 24 that is not broken away. Circulation hole 82 across from hole 78 is shown in FIGS. 6 and 7. At the upper left corner of FIG. 2, the support plate 12 is broken away so that circulation hole 96 in support plate 14 is exposed. The stack of support plates each has the clearance hole for the clamp bolts, each has the plenum, each has the cross webs which divide the plenum, and each has the circulation holes so that fluid entering the inlet opening 44 has access through the plenums and the channels between the webs to provide uniform flow. The fluid outlet opening is in the bottom plate 26 diagonally from the fluid inlet opening 44, is shown in dashed lines in FIGS. 2 and 3, and is indicated by reference character 98 in bottom plenum cover 26. This positioning of the inlet opening, outlet opening, circulation holes and webs defines plenums and channels which have an equal pressure drop so that each of the stacked support plates has the same flow therebeneath so that cooling by the fluid is uniformly achieved.

Figure 4:
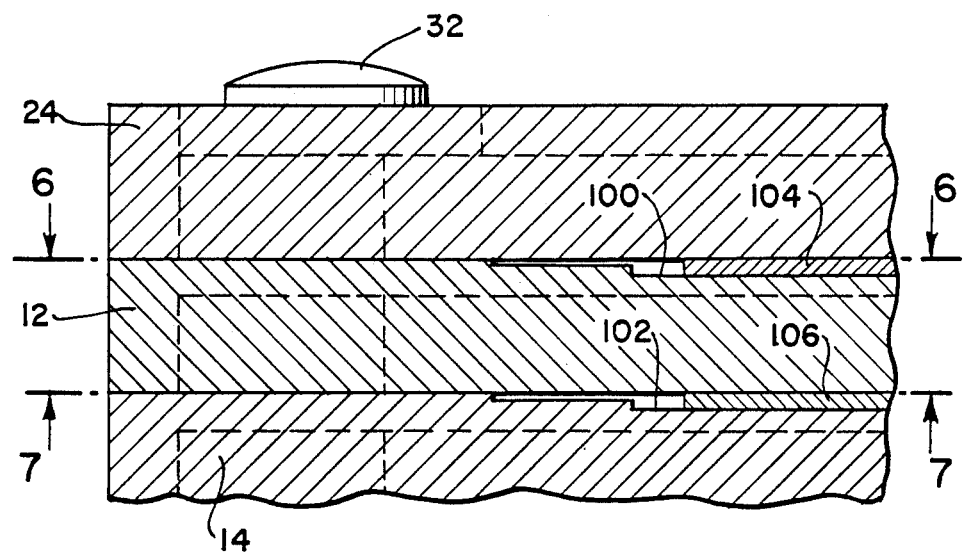
FIG. 4 is an enlarged section taken generally along line 4—4 of FIG. 6, with parts broken away.

Each of the support plates has a shallow recess in its top surface. Recess 100 is shown in FIG. 6 and recesses 100 and 102 are shown in the top of support plates 12 and 14 in FIGS. 4 and 5. It is into these recesses in which wafers are placed and secured. The support plates, as well as the top and bottom plates, are preferably of an aluminum-containing alloy for high thermal conductivity and light weight. They are anodized and passivated for resistance to corrosion. Similarly, any wafers installed are passivated to avoid electrical coupling and to protect the integrated circuitry thereon from corrosion by ionic contaminants. Wafers 104 and 106 are illustrated in FIGS. 3, 4 and 5 as being mounted in the recesses 100 and 102 in support plates 12 and 14. It is understood that the wafers each incorporate therein a plurality of semiconductor electronic devices.

The wafers may be attached in their recesses by a high thermal conductivity adhesive to enhance cooling, although adequate cooling is anticipated by direct impingement of the coolant fluid on the wafer surfaces.

Electrical attachment to the wafers is accomplished by means of ribbon conductors in flexible cable. These ribbon conductors comprise a plurality of parallel or fanned conductors of thin metallic material, such as copper, silver or gold. The cables are flexible ribbonlike structure with the individual ribbon conductors as the inner layer enclosed between two flexible dielectric layers. Exteriorly of these dielectric layers are metal foil layers which serve as shields to the conductors to prevent crosstalk between the leads connected to adjacent wafers. In addition, the foils serve as voltage and ground supplies to the wafer. The foils interact with the conductors to make controlled impedance signal lines. The foils are covered on the outside with flexible dielectric synthetic polymer composition material.

Flexible cables 108 and 110 are shown as extending from the left end of wafers 104 and 106 in FIG. 3. As is seen in FIG. 2, there are five such flexible cables, each with a plurality of conductors, connected to the left edge of the wafer 104. There is a similar group of flexible cables connected to the right end, as shown in dashed lines in FIG. 2. This provides a substantial number of connections to each wafer. The inner ends of the conductors are connected to the pads on the edges of the wafer by any convenient attachment means, such as thermocompression bonding. The outer end of each cable passes through its own slot in the interconnection board.

The interconnection board may be a printed wiring board so that signal lines can be connected to pads on the printed wiring board to serve as I/O connections or to serve as connections to the wafer interconnecting circuitry within the printed wiring board. For the purpose of attachment, these pads are clean, as are the corresponding surfaces of the conductors in the cables. After attachment, these surfaces are passivated.

In order to provide exit for the flexible cables from the interior of the package, cable recesses are provided in the tops of the support plates, such as the recess 112 shown in FIG. 6 and the recesses 112 and 114 shown at the left side of FIG. 3 in the top surfaces of plates 12 and 14. In FIG. 2, the recess 114 is shown in the upper left hand corner as extending from the wafer recess 102 to the left edge of the support plate 14. Even with these recesses, the clearances are quite close. In order to localize the sealing region, a clearance recess 116 is formed on the underside along the edge, see FIG. 7, to define a ridge 118 which localizes the plate's pressure on the periphery of the edge sealed plenum. As a result, the sealing of the interior space is easily achieved. Upon assembly, dielectric sealant 120 such as silicone adhesive is employed to achieve a tight seal at the locations where the flexible cable exits from the stack of support plates.

During assembly the webs in the plenums extending towards the wafers are sealed to the wafers by means of a thin layer of preferably elastomeric dielectric adhesive-sealant 122 such that electrical isolation is achieved between the webs and the wafer circuitry, and the gaps are sealed against fluid leakage. All surfaces in contact with coolant are passivated with a protective coating.

The interconnection boards 40 and 42 support the outer ends of the flexible cables. The flexible cables extend out through corresponding slots and are turned down to secure the outer ends of the flexible cables. The conductors in those flexible cables may be exposed at the frames 40 and 42 and attached to printed wiring on those frames. In this way, interconnection between different levels within the stacked wafer electronic package can be achieved.

The coolant fluid inlet opening 44 is connected to a suitable source of coolant, preferably a dielectric liquid. This liquid flows through the plenum spaces and is in direct contact with the upper surfaces of the wafers to provide direct cooling. The cooling of the lower side of the wafer is achieved by the attachment of the wafer to the support plate and the cooling of the lower surface of the support plate by the next lower flow stream of the coolant fluid.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. An electronic package comprising:
   at least first and second support plates and a bottom support plate, each of said support plates having a support surface thereon, a semiconductor wafer directly supported on said support surface of each of said support plates, each of said support plates having a plenum formed therein, said first and second support plates and said bottom support plate being stacked so that said first support plate is on tope of said second support plate so that said plenum of said first support plate directly faces said support surface of said second support plate;
   a top plate engaging on and covering said first support plate and a bottom plate beneath and covering the bottom of said bottom support plate, said top plate, said support plates and said bottom plate being stacked;
   a plurality of webs formed in each of said plenums so that aid webs extend toward the support surface of the facing support plate to lie closely adjacent said semiconductor wafer supported on said facing support surface, a resilient adhesive between said webs and said semiconductor wafer so that said semiconductor wafer is supported by said webs on the side of said semiconductor wafer away from said support surface and said webs and said adhesive enclose channels through each plenum over said semiconductor wafers;
   a fluid opening in said bottom plate, a fluid opening in said top plate, said plenums being arranged so that fluid entering one of said openings passes through said plenums to the other of said openings so that said wafers on said support surfaces are directly in contact with fluid and are cooled by fluid passing through said plenums.

2. The package of claim 1 wherein:
   at least one interconnection board is mounted on said package;
   and further including;
   a flexible cable having a plurality of conductors therein, said plurality of conductors being attached to one of said wafers mounted on said surfaces and said flexible cable being supported on said interconnection board so that electrical connection is made between a wafer on said interior wafer support surface of said package and said interconnection board.

3. The package of claim 2 wherein said support plates are sealed with respect to each other and sealed around said flexible cable so that liquid coolant can be employed in said plenums without leakage from said package.

4. The package of claim 2 wherein each said support plate has first and second sides and said wafer support surface is on said first side of each said support plate and said plenum is formed as a recess in said second side of each of said support plate so that said support surface on said second support plate is exposed to said plenum on said second side of said first support plate.

5. The package of claim 4 wherein there is a plurality of flexible cables extending from each of said support plates and said plurality of flexible cables is engaged and supported by said interconnection board, said interconnection board having printed wiring conductors thereon interconnected to conductors in said flexible cables.

6. An electronic package comprising:
   a top plate and a bottom plate, said top and bottom plates having an inlet opening and an outlet opening;
   a plurality of support plates each having a first side and a second side, said support plates being positioned between said top and bottom plates to form a stack of support plates, said top and bottom plates and said support plates being secured together to form a separable unitary structure;
   each of said support plates having a wafer support surface on the first side thereof, a wafer mounted on each said support surface, each of said support plates having a recess in the second side thereof forming a plenum, a plurality of webs formed in each said plenum, said support plates being stacked so that said plenum, said support plates being stacked so that said plenum in one said support plate faces said support surface of and adjacent said support plate, said webs being sufficiently long so that they substantially engage said wafers to substantially enclose channels through each plenum between said webs, said support plates each having at least one opening therethrough so that fluid entering said inlet and passing out of said outlet passes through said plenums for cooling wafers supported on said support surfaces and facing said plenums.

7. The package of claim 6 wherein there are webs formed in said plenums which extend towards the support surface of the facing support plate.

8. The package of claim 6 wherein said webs extend substantially all the way across said plenum but terminate short of the plenum wall so as to permit fluid flow to the spaces between said webs.

9. The package of claim 8 wherein there is a plurality of openings through each of said support plates adjacent said plenum wall so that fluid can flow from one plenum to the next.

10. The package of claim 6 wherein there is adhesive between each said web ant the adjacent wafer so that each web is sealed to said wafer on said facing support surface to enclose said channels through each plenum between said webs.

11. The package of claim 10 wherein an interconnection board is mounted on said package and a flexible cable has its outer end secured to said interconnection board and its inner end positioned for attachment to a wafer so that electrical connections may be made to wafers on said support surface.

12. The package of claim 11 where further flexible cables are provided and are sealed with respect to said support plates so that said plenums are enclosed to avoid fluid leakage from said plenums.

13. The package of claim 12 wherein at least one of said flexible cables extends into each said plenum and each of said plurality of cables is attached to said interconnection board, said interconnection board having printed wiring circuits thereon and said flexible cables having at least some of their conductors connected to said printed wiring conductors on said interconnection board.

14. The package of claim 13 wherein there are two of said interconnection boards on said package and flexible cables each having a plurality of conductors extend from each said support surface to each of said interconnection boards.

15. The package of claim 6 wherein a interconnection board is mounted on said package and a flexible cable has its outer end secured to said interconnection board and its inner end positioned for attachment to a wafer so that electrical connections may be made to wafers on said support surface.

16. The package of claim 15 wherein further flexible cables are provided and are sealed with respect to said support plates so that said plenums are enclosed to avoid fluid leakage from said plenums.

17. The package of claim 16 wherein said plurality of flexible cables extends into said plenums and each of said plurality of cables is attached to said interconnection board, said interconnection board having printed wiring circuits thereon and said flexible cables having at least some of their conductor connected to said printed wiring conductors on said interconnection board.

18. The package of claim 17 wherein there are two of said interconnection boards on said package and said flexible cables each having a plurality of conductors extend from each said support surface to each of said interconnection boards.

19. The package of claim 11 further including a semiconductor wafer mounted on a said support surface, said semiconductor wafer being electrically connected to said flexible cable and said semiconductor wafer being passivated to eliminate contact between said semiconductor wafer and fluid in said plenum.

20. The package of claim 15 further including a semiconductor wafer mounted on each said support surface, said semiconductor wafer being electrically connected to said flexible cable and said semiconductor wafer being passivated to eliminate contact between said semiconductor wafer and fluid in said plenum.

21. An electronic package comprising:
a top plate and a bottom plate, said top and bottom plates having an inlet opening and an outlet opening;
a plurality of support plates, each said support plate having a first side and a second side, said support plates being positioned between said top and bottom plates to form a stack of support plates, said top and bottom plates and said support plates being secured together to form a separable unitary structure;
each of said support plates having a wafer support surface on the first side thereof and an integrated surface wafer directly mounted on each said wafer support surface, each of said support plates having a recess in the second side thereof forming a plenum so that said plenum on one said support plate faces said semiconductor wafer on said support surface on an adjacent said support plate, said support plates each having at least one opening therethrough so that fluid entering said inlet and passing out of said outlet passes through said plenums for cooling said semiconductor wafers supported on said support surfaces and facing said plenum;
an interconnection board mounted on said package, a plurality of flexible cables each having a board end and a wafer end, each of said flexible cables having a plurality of conductors therein with said conductors at said board end of said cables being connected to said interconnection board and said conductors on said wafer end being connected to said semiconductor wafers, said flexible cables extending between said support plates with their conductors extending into said plenums, said flexible cables being sealed with respect to said support plates so that said plenums are enclosed.

* * * * *